(12) United States Patent
Seidl et al.

(10) Patent No.: US 10,098,223 B2
(45) Date of Patent: Oct. 9, 2018

(54) SENSOR DEVICE WITH A FLEXIBLE ELECTRICAL CONDUCTOR STRUCTURE

(71) Applicant: SCHREINER GROUP GMBH & CO. KG, Oberschleissheim (DE)

(72) Inventors: Peter Seidl, München (DE); Sebastian Gepp, München (DE); Thomas Weik, Gäufelden (DE); Manfred Hartmann

(73) Assignee: SCHREINER GROUP GMBH & CO. KG, Oberschleissheim (DE)

( * ) Notice: Subject to any disclaimer, the term of this patent is extended or adjusted under 35 U.S.C. 154(b) by 0 days.

(21) Appl. No.: 14/792,284

(22) Filed: Jul. 6, 2015

(65) Prior Publication Data

US 2016/0014884 A1 Jan. 14, 2016

(30) Foreign Application Priority Data

Jul. 9, 2014 (DE) .................. 10 2014 109 621
Jan. 12, 2015 (DE) .................. 10 2015 100 297

(51) Int. Cl.
*H05K 1/02* (2006.01)
*H05K 1/03* (2006.01)
(Continued)

(52) U.S. Cl.
CPC ........... *H05K 1/028* (2013.01); *H05K 1/0298* (2013.01); *H05K 1/0346* (2013.01);
(Continued)

(58) Field of Classification Search
CPC ... H05K 1/02; H05K 1/09; H05K 1/11; H05K 3/00; H05K 3/02; H05K 3/38; H05K 3/44;
(Continued)

(56) References Cited

U.S. PATENT DOCUMENTS 5,231,751 A * 8/1993 Sachdev ............... H01L 21/486
216/18
5,505,321 A * 4/1996 Caron .................. H05K 3/0097
174/250

(Continued)

FOREIGN PATENT DOCUMENTS

DE 10254782 A1 6/2004
EP 0801423 A2 10/1997
(Continued)

OTHER PUBLICATIONS

Pacholec, "International Search Report in International Application No. PCT/ DE2015/100281", dated Oct. 9, 2015, 3 pages.

*Primary Examiner* — Xiaoliang Chen
(74) *Attorney, Agent, or Firm* — Johnson, Marcou & Isaacs, LLC; Jennifer S. Stachniak

(57) ABSTRACT

A sensor device for integration in an electrical circuit, including a support layer (12'), which is formed with a release layer; at least one flexible insulating layer (14', 32), which is made using a printing method; and at least one flexible electrical conductor structure (20', 34), which is applied with a printing method onto the insulating layer (14). The insulating layer (14', 32) and the conductor structure (20', 34) form a flexible unit, which is removable without damage from the support layer (12').

8 Claims, 2 Drawing Sheets

(51) Int. Cl.
*H05K 1/16* (2006.01)
*H05K 1/11* (2006.01)
*H05K 3/00* (2006.01)
*H05K 3/04* (2006.01)
*H05K 3/12* (2006.01)
*H05K 1/09* (2006.01)
*H05K 3/28* (2006.01)
*H05K 3/46* (2006.01)

(52) U.S. Cl.
CPC .......... *H05K 1/0393* (2013.01); *H05K 1/097* (2013.01); *H05K 1/115* (2013.01); *H05K 1/16* (2013.01); *H05K 3/007* (2013.01); *H05K 3/048* (2013.01); *H05K 3/1216* (2013.01); *H05K 3/4644* (2013.01); *H05K 1/092* (2013.01); *H05K 3/12* (2013.01); *H05K 3/28* (2013.01); *H05K 3/4632* (2013.01); *H05K 2201/10151* (2013.01)

(58) Field of Classification Search
CPC . H05K 3/46; H05K 3/97; H01L 21/02; H01L 21/48; H01L 21/52; H01L 23/52
USPC ....... 174/254, 250, 256, 257, 261, 262, 382; 438/23, 127; 28/846, 852, 600; 428/607, 428/609, 612, 626; 156/233, 750, 937; 29/846, 852, 600
See application file for complete search history.

(56) References Cited

U.S. PATENT DOCUMENTS

| | | | |
|---|---|---|---|
| 6,027,958 A * | 2/2000 | Vu | H01L 21/568 257/679 |
| 6,166,915 A | 12/2000 | Lake et al. | |
| 6,385,473 B1 * | 5/2002 | Haines | A61B 5/0006 600/382 |
| 6,392,143 B1 * | 5/2002 | Koshio | H01L 21/563 174/254 |
| 2001/0027922 A1 * | 10/2001 | Chen | H05K 3/025 205/170 |
| 2002/0079133 A1 * | 6/2002 | Yamamoto | H05K 3/025 174/256 |
| 2002/0160219 A1 * | 10/2002 | Brenneman | H05K 3/025 428/626 |
| 2002/0192486 A1 * | 12/2002 | Chen | C25D 1/04 428/607 |
| 2004/0060162 A1 * | 4/2004 | Moren | H01Q 1/38 29/601 |
| 2006/0219428 A1 * | 10/2006 | Chinda | H05K 3/421 174/257 |
| 2007/0085838 A1 * | 4/2007 | Ricks | G06F 3/0412 345/173 |
| 2007/0102103 A1 * | 5/2007 | Ku | H05K 3/046 156/233 |
| 2007/0173711 A1 * | 7/2007 | Shah | A61B 5/14532 600/347 |
| 2007/0218378 A1 * | 9/2007 | Drews | H05K 3/046 430/58.8 |
| 2007/0235218 A1 * | 10/2007 | Miyamoto | H01L 21/4857 174/261 |
| 2008/0180234 A1 * | 7/2008 | Yamanaka | B60N 2/5685 340/438 |
| 2008/0202661 A1 * | 8/2008 | Kobayashi | H01L 21/4857 156/50 |
| 2008/0254392 A1 * | 10/2008 | Yang | H05K 1/0346 430/311 |
| 2009/0061721 A1 * | 3/2009 | Isa | H01L 27/1266 445/24 |
| 2011/0143501 A1 * | 6/2011 | Oda | C08L 63/00 438/127 |
| 2011/0248291 A1 * | 10/2011 | Jinbo | H01L 29/66969 257/88 |
| 2011/0304520 A1 * | 12/2011 | Djordjevic | H01Q 21/0087 343/893 |
| 2012/0157804 A1 * | 6/2012 | Rogers | A61B 5/0422 600/345 |
| 2012/0165759 A1 * | 6/2012 | Rogers | A61B 5/6867 604/264 |
| 2012/0187399 A1 * | 7/2012 | Fukuda | H01L 29/78603 257/43 |
| 2012/0228106 A1 * | 9/2012 | Horino | G06F 3/044 200/5 A |
| 2012/0298497 A1 * | 11/2012 | Maeda | C09J 133/064 200/600 |
| 2013/0004750 A1 * | 1/2013 | Majumdar | H01L 51/0022 428/202 |
| 2013/0004753 A1 * | 1/2013 | Majumdar | H01L 51/0024 428/209 |
| 2013/0041235 A1 * | 2/2013 | Rogers | A61B 5/6867 600/306 |
| 2014/0098501 A1 * | 4/2014 | Kawaguchi | H05K 1/0277 361/750 |
| 2014/0375916 A1 * | 12/2014 | Chen | G02F 1/133305 349/33 |

FOREIGN PATENT DOCUMENTS

| | | |
|---|---|---|
| EP | 1855514 A1 | 11/2007 |
| EP | 2267218 A1 | 12/2010 |
| WO | 9960829 A2 | 11/1999 |
| WO | 1999060820 A1 | 11/1999 |
| WO | 2006000821 A1 | 1/2006 |

* cited by examiner

SENSOR DEVICE WITH A FLEXIBLE ELECTRICAL CONDUCTOR STRUCTURE

BACKGROUND OF THE INVENTION

The present invention relates to a sensor device with a flexible electronic conductor structure for integration in an electrical circuit, which has an insulating layer, on which an electrical conductor structure is mounted.

These types of device are known in a variety of forms in practice and can be integrated in a more complex electrical circuit by connection to further components, for example, to a test circuit, a power source, a sensor or the like. During production, until now, for example, a substrate is used as an insulating layer, on which the conductor structure can be pressed. The substrate can be a printed circuit board or also a flexible film, such as the products distributed under the tradenames Flexfoil, Kapton, Ito-Film, and Melinex. The substrate is pressed with an electrical conductive dye, which can include conductive components, such as silver, copper, conductive polymers, graphite, graphene, or the like, for forming the conductor structure. Alternatively, the conductor structures can be made also according to an etching technique, a vapor deposition technique, or a stamping technique. If the insulating layer is made from a film or from paper, in addition, an adhesive layer can be provided, so that the device provided with the electrical conductor structure is self-adherent, and for example, like an RFID label, can be fixed to a background, in particular, a device, a library book, or the like.

Until now, the application of electrical conductor structures using printing methods, in particular, a screen process, was limited to specialized substrates. With substrates, which must fulfil further functionalities, for example, the absorption of moisture, it is not possible to print the electrical conductor structures. The limitations for printability are provided, in particular, in that a background structure does not permit a continuous conductive printing, that the related substrate has no adequate heat resistance in order to endure a drying process without being damaged, that the substrate has no adequate surface voltage for a printing process, that the substrate with regard to its shape, its curvature, and/or its grammage is unsuitable for a printing method.

In WO/9960820 A2, a printed electrical circuit is described, which contains a printing support comprising a flexible, flat and electrical insulating material, which is imprinted on both sides with electrical conductor tracks, whereby the conductor tracks of the two sides can be connected to one another in an electrically conductive manner by at least one opening in the printing support. The electrical conductor tracks printed onto the support medium serve exclusively as current conductors, without having any sensor properties.

In EP 2 267 218 A1, a multi-layer label is provided, which can be imprinted or fused on using the effects of heat onto a piece of clothing. An RFID (radio frequency identification device) can be integrated into this label. This RFID has no sensor properties.

SUMMARY OF THE INVENTION

The invention is based on the object of providing a sensor device for integration into an electrical circuit, which has a flexible electrical conductor structure and which can be transferred onto a variety of substrate types.

According to the present invention, a sensor device for integration into an electrical circuit is proposed, which includes:
  a support layer, which is formed with a release layer,
  at least one flexible insulating layer, which is made according to a printing method,
  at least one flexible electrical conductive structure, which is mounted according to a printing method onto the insulating layer, whereby the insulating layer and the conductor structure form a unit, which is detachable without damage from the support layer.

With the sensor device according to the present invention, then, a unit is provided, which is detachable from the support layer and can be connected via corresponding supply connections with further electrical components. By means of flexible formation of the insulating layer and the conductor structure, this unit can be adapted with regard to its shape to a variety of substrates. Thus, also substrates, which are unsuitable for a direct printing process, can be provided with a conductive structure, without harming the substrate onto which the unit made from the insulating layer and the conductor structure is transferred.

According to the present invention, in addition, a device for integration in an electrical circuit is provided, including:
  at least one flexible insulating layer, which is made according to a printing method;
  at least one flexible electrical conductor structure, which is applied according to a printing method onto the insulating layer, whereby the insulating layer and the conductor structure form a substrate-free and support-free flexible unit.

The device can be used directly after its production; that is, it does not need to be detached from a support layer.

The component, with which the electrical conductor structure can be connected, can be a more complex electrical circuit or also only a simple electrical component, such as a power supply unit. In particular, the electrical conductor structure can be connected with an evaluation unit, whereby then the electrical conductor structure can be a sensor structure, with which the particular measurement can be determined, for example, a humidity rating or a temperature.

The support layer represents an interim printing support, which only is important during production of the device. The unit comprised of the insulating layer and the conductor structure is detachable from the support layer for integration into the electrical circuit. In order to enable this, the support layer is formed with the release layer, which adjoins the print layer applied to the support layer. The bond between the print layer and the release layer is therefore minimal.

With a specialized embodiment of the device according to the invention, the insulating layer is imprinted onto the support layer (downcoat).

In particular, the flexible insulating layer comprises an electrical insulating lacquer, which has a film-forming characteristic, which is adjustable by means of the screen printing parameter (screen thickness, mesh) and the lacquer composition (chemical). The shape or the outline of the insulating layer can be freely selected; that is, the insulating layer can be flat, lamellar, and/or be formed as a grid, or can have any other form that is producible in printing technology.

Preferably, the insulating layer is formed from a lacquer, which can be a modified lacquer. Basically, however, the insulating layer is not limited to this type of lacquer. In addition, basic lacquers can be used, which can be printed with a sufficient thickness and which themselves are printable. Lacquer that can be modified can be hardened, for example, by using UV light.

Depending on the respective application, the insulating layer can have a high mechanical stability or be fragile. In order to form a determined range with a higher mechanical rigidity and stability, the insulating layer can be formed at least in areas to be multi-layered. This means that in the multi-layered regions, multiple printing layers are formed over one another.

The flexible conductor structure can include active and/or passive electrical or electronic components. The components can be connected after printing of the conductor structure with these, for example, adhered, or also can be produced themselves during the printing process.

The insulating layer and the electrical conductor structure are, respectively, preferably produced according to a screen printing method. Also, the electrical conductor structure can take any typographical form that can be contemplated. In this regard, preferably a conductive printed amount is used, which contains silver, copper, carbon bonds, in particular, carbon, a conductive polymer printing ink, graphene, and/or conductive dyes of nano-particles.

The device according to the invention can have multiple, flexible electrical conductor structures, which are separated from one another by a flexible insulating layer. The electrical conductor structures that are separated from one another, therefore, can represent with a projection crossed lines perpendicular to the separating insulating layer (crossover). Thus, on both sides of the flexible insulating layer, a functionality can be realized. For example, a moisture detector can be realized by means of the two electrical conductor structures, respectively, which are separated from one another.

The electrical conductor structures, which thus are formed as a multi-layer conductor structures, can be electrically separated from one another or also electrically connected to one another. In order to produce an electrical connection of both conductor structures, which are separated from one another by the insulating layer, a so-called feed-through can be realized. In this regard, the insulating layer is provided with at least one recess, which can be seen as a tiny hole and which is filled by the printing dimensions by at least one of the conductor structures. During printing of the insulating layer, then, at least one point is kept open, which is filled with a subsequent printing process for the conductor structure with the printing dimensions of the conductor structure, so that an electrical connection to the conductor structures arranged on the other side of the insulating layer is formed. No separate process for making the recess is required, since this is produced in process during printing of the insulating layer.

The device according to the present invention can be a strip, for example, which can be used for detection of moisture. In this regard, based on the moisture on the conductor structure, a short circuit is produced, which can be further processed by a corresponding evaluation unit. The strip, which can have an electrical conductor structure on both sides, is connected in regions with an absorbent material (fibrous web, tissue, or the like), for example, via an imprinted adhesive layer or an adhesive layer applied in another form. A moisture sensor can be used, for example, as a detector for recognizing incontinence.

When the above-described construction with multiple conductor structures is selected, which has conductor tracks applied according to the so-called crossover method, which cut in an angle of approximately 90°, a strain sensor can be provided, which is sensitive in two spatial directions, since the electrical resistance of a conductor changes with its geometry, that is, with its length, its height and its width.

The indicator or sensor formed by the device can be connected with an evaluation unit. A terminal region for the evaluation unit can be reinforced by multi-layered construction of the insulating layer. It is also contemplated that the device according to the invention is connected with a component, which can communicate wirelessly with an evaluation unit.

The actual end product of the device according to the invention comprises only at least one flexible insulating layer and at least one flexible electrical conductor structure. Thus, no separate, imprintable substrate is required, which must be provided with a conductor structure. In addition, the unit can be drive independently or in connection with any desired substrate.

The geometry of the conductor structure and the insulating layer is determined by the printing method, according to which the device of the present invention is made.

The entire printing buildup during production occurs from below to above, that is, layer to layer. Thus, the printing buildup also is suitable for a continuous process, in which the web is not turned.

The electrical conductor structure can be covered by an additional printing layer or also lie open. By means of the individual printing layers, the flexibility of the device can be selectively affected. In particular, the unit made of the conductor structure and the insulating layer, when necessary, can be formed to be very fragile, and in particular, with a manipulation, can be self-destructive.

It is contemplated that the device can be transferred by means of a hot-melt method onto a substrate. Likewise, it is contemplated that the device of the present invention can be back-injection molded with plastic during production of further components and so can be made into a specific form. The deformation of the unit made from the insulating layer and the conductor structure can take place by corresponding adjustment of the printing layers in view of geometry, material and the like.

BRIEF DESCRIPTION OF THE DRAWINGS

Exemplary embodiments of the sensor device according to the invention are schematically shown in the drawings and are described in greater detail in the following description. In the drawings.

DETAILED DESCRIPTION OF THE PREFERRED EMBODIMENTS

Figure 1:
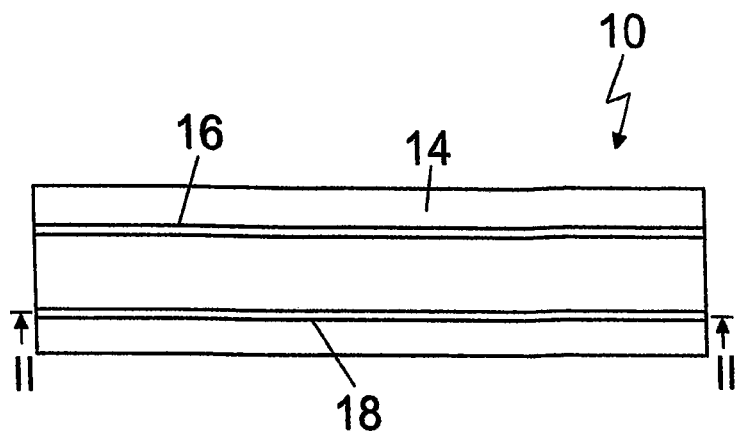
FIG. 1 shows a plan view of a sensor device according to the invention, which is formed as an incontinence sensor.
Figure 2:
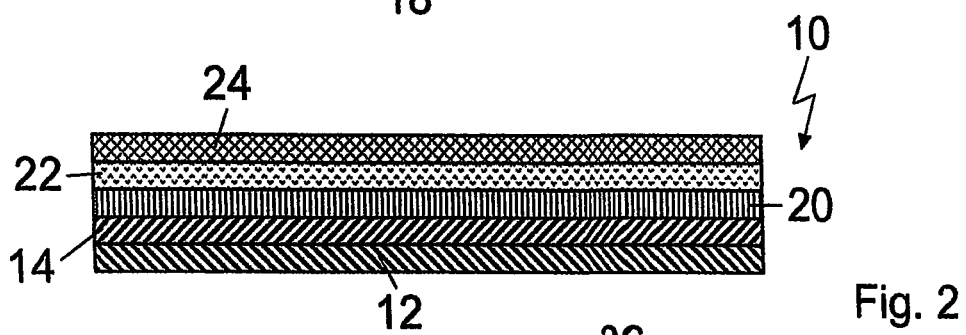
FIG. 2 shows a section through the device according to FIG. 1 along the line II-II in FIG. 1.

In FIGS. 1 and 2, a dampness or moisture sensor 10 for monitoring the incontinence of a person is shown. The sensor 10 is formed as flexible strips, which, for example, can be adhered to an individual's pants specifically designed for this purpose. The sensor 10, which is shown in the drawing in its condition after assembly, includes a support layer 12, which is formed as a release film, that is, a film with a release layer, and an interim print substrate. An insulating layer 14 is applied onto the support film 12 via a screen printing process, the insulating layer 14 comprising a lacquer made from a polyurethane base, which is hardened by means of UV radiation. The insulating layer 14 has a high flexibility.

On the insulating layer 14, a conductor structure 20 formed from two electrical conductors 16 and 18 is imprinted, which likewise is formed to be flexible. The conductor structure 20 is formed from a conductive printing material is made from a copper base.

Figure 5:
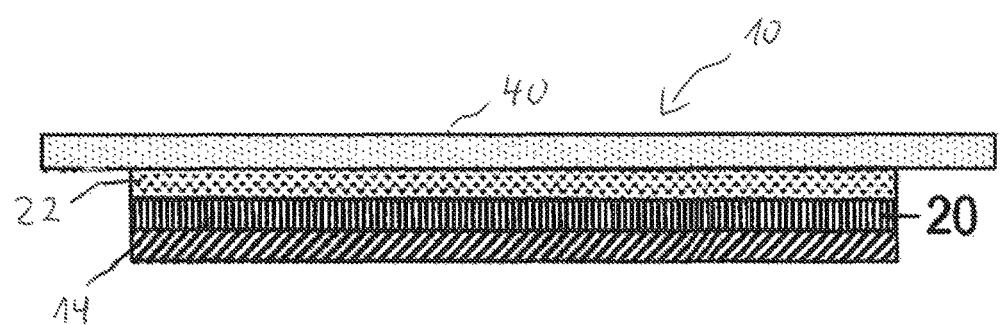
FIG. 5 shows an arrangement of the sensor device on a substrate by means of an adhesive layer.

In order to enable attachment of the unit made from the insulating layer 14 and the conductor structure 20 to a substrate 40, for example, the pants of the person, so that the unit is removable from the release layer without damage, an adhesive layer 22 is formed on the conductor structure 20, which likewise can be applied according to a printing method. (See FIG. 5). For protection of the adhesive layer before assembly, a cover layer 24 can be provided, which likewise is formed as a so-called release film.

Figure 3:
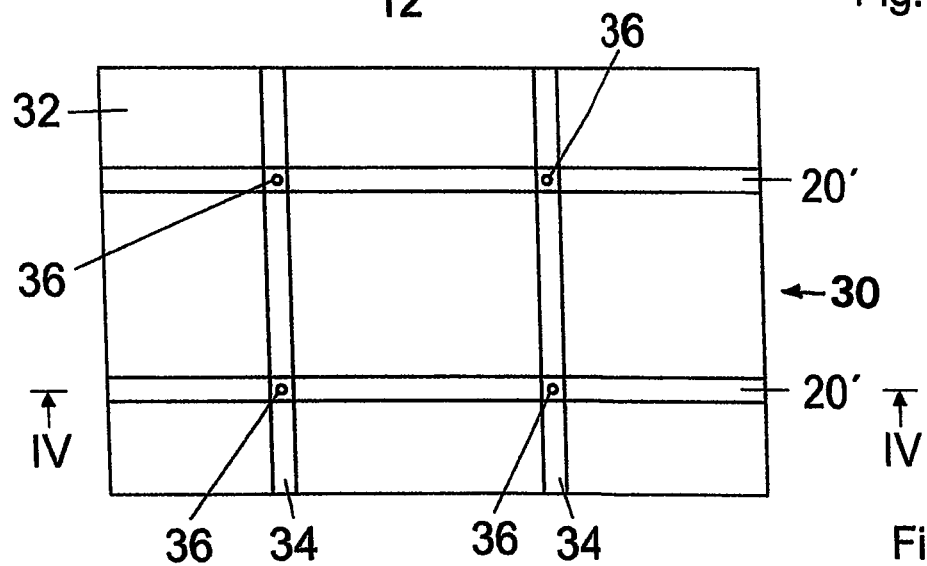
FIG. 3 shows a plan view of an alternative embodiment of a device according to the invention, which is formed as a strain sensor.
Figure 4:
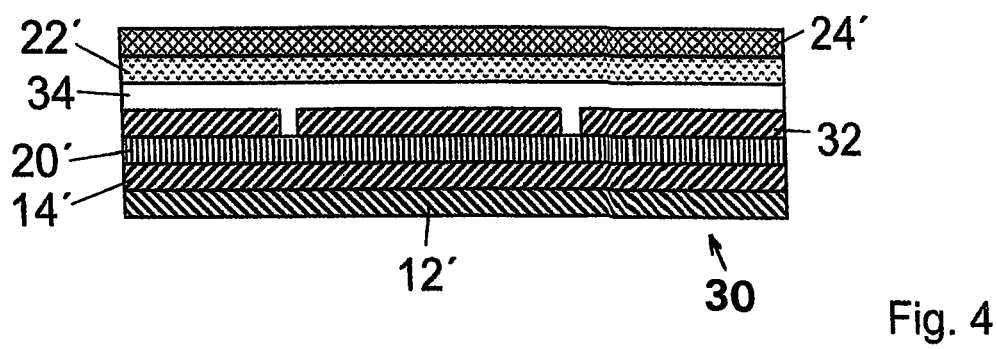
FIG. 4 shows a section through the device according to FIG. 3 along line IV-IV in FIG. 3.

In FIGS. 3 and 4, a strain sensor 30 is shown, which has a support layer 12' according to the embodiment of FIGS. 1 and 2, which serves as an interim print support, on which first an insulating layer 14' is placed during production. The insulating layer 14' is formed from a lacquer made from a polyurethane base and is applied to the support layer 12' according to a print screen method.

On the insulating layer 14', an electrical conductor structure 20' is applied according to a print screen method, which comprises a plurality of parallel, strip-like conductors, which are formed from a printing material containing silver. Also, the conductor structure 20' has a high flexibility.

A second insulating layer 32 is imprinted onto the conductor structure 20', and likewise according to a print screen method and by application of a polyurethane printing material.

A second flexible electrical conductor structure 34 is imprinted on the side of the insulating layer 32 facing the electrical conductor structure 20', which comprises strip-like electrical conductors, which run at right angles to the strips of the electrical conductor structure 20'.

In order to produce an electrical connection between the electrical conductor structure 34 and the electrical conductor structure 20', a recess 36 is formed in the insulating layer 32, which is produced by excluding the corresponding point during printing of the insulating layer 32. The recess 36 is filled with the printing material of the second electrical conductor structure 34, so that the electrical connection between the two conductor structures 34 and 20' is realized.

According to the embodiment shown in FIGS. 3 and 4, the strain sensor 30 has an adhesive layer 22', which likewise is applied via a print screen method and is protected by means of a covering 24'. For assembly, the cover layer 24', which is formed as a release film, is pulled off, so that the strain sensor 30 can be attached via the adhesive layer 22' to a substrate 40 (See also FIG. 5).

The electrical conductor structures 20' and 34 of the strain sensor 30 as well as the conductors 16 and 18 of the electrical conductor structure 20 of the moisture detector according to FIGS. 1 and 2 can be connected with a corresponding, suitable evaluation unit.

We claim:

1. A self-destructive sensor device for integration into an electrical circuit, comprising:
    at least one flexible insulating layer (14, 14', 32);
    at least one flexible electrical conductor structure (20, 20', 34), which is applied with a printing method onto the insulating layer (14, 14', 32);
    an adhesive layer (22) arranged above the electrical conductor structure (20, 20', 34); and
    a cover layer (24, 40) arranged on the adhesive layer (2), wherein the cover layer (24) is formed as a substrate (40) or as a release film (24) to protect the adhesive layer (22),
    wherein the at least one flexible insulating layer (14, 14', 32) and the at least one flexible conductor structure (20, 20', 34) form a fragile, flexible unit which is self-destructive by manipulation.

2. The sensor device according to claim 1, wherein the insulating layer (14, 14', 32) is made from a lacquer.

3. The sensor device according to claim 2, wherein the lacquer is a modified lacquer.

4. The sensor device according to claim 1, wherein the insulating layer is formed at least in regions as multi-layered.

5. The sensor device according to claim 1, wherein the conductor structure (20, 20', 32) is formed from a conductive printing material, wherein said conductive printing material is selected from the group consisting of copper, silver, a carbon bond, a conductive polymer structure, graphene, and/or a conductive dye of nano-particles.

6. The sensor device according to claim 1, wherein the at least one flexible insulating layer (32) is arranged between two electrical conductor structures (20', 34).

7. The sensor device according to claim 6, wherein the at least one insulating layer (32) arranged between the two conductor structures (20', 34) has at least one recess (36), wherein the two conductor structures (20', 34) are electrically connected to one another via said at least one recess (36), wherein the at least one recess (36) is filled by at least one conductor structure (34).

8. The use of the sensor device of claim 1 as a device that is self-destructive by manipulation.

* * * * *